(12) United States Patent
Liu et al.

(10) Patent No.: US 7,830,198 B2
(45) Date of Patent: Nov. 9, 2010

(54) MULTI-INPUT MIXER, MIXER DEVICE, AND MIXING METHOD

(75) Inventors: Ren-Chieh Liu, Chonghua County (TW); Turut Sefket Aytur, Plattsburgh, NY (US)

(73) Assignee: Realtek Semiconductor Corp., Hsinchu (TW)

(*) Notice: Subject to any disclaimer, the term of this patent is extended or adjusted under 35 U.S.C. 154(b) by 279 days.

(21) Appl. No.: 12/109,506

(22) Filed: Apr. 25, 2008

(65) Prior Publication Data

US 2009/0267676 A1 Oct. 29, 2009

(51) Int. Cl.
*G06G 7/12* (2006.01)
(52) U.S. Cl. .......................... 327/355; 327/359; 327/361
(58) Field of Classification Search ......... 327/355–361; 455/325, 326, 333
See application file for complete search history.

(56) References Cited

U.S. PATENT DOCUMENTS

| 7,062,247 B2* | 6/2006 | Kovacevic et al. ........... 455/333 |
| 7,657,246 B2* | 2/2010 | Shen et al. ................... 455/333 |
| 2004/0121751 A1* | 6/2004 | Shen ........................... 455/323 |

* cited by examiner

*Primary Examiner*—Long Nguyen
(74) *Attorney, Agent, or Firm*—Thomas, Kayden, Horstemeyer & Risley, LLP

(57) ABSTRACT

A mixer device includes a differential circuit, a transconductance circuit, and a selecting circuit. The differential circuit receives a differential input signal and generates a differential output signal. The transconductance circuit is coupled to the differential circuit, receives a plurality of radio frequency input signals, and determines to mix at least one of the radio frequency input signals with the differential input signal according to an enable signal. The selecting circuit receives a control signal and generates the enable signal according to the control signal.

24 Claims, 6 Drawing Sheets

MULTI-INPUT MIXER, MIXER DEVICE, AND MIXING METHOD

BACKGROUND OF THE INVENTION

1. Field of the Invention

The invention relates to a mixer, more particularly to a multiple-input mixer.

2. Description of the Related Art

Ultra wide band (UWB) communications is widely used in high data rate transmissions. Ultra wide band communications permits data to be transmitted within a wide frequency interval ranging between 3.168 GHz and 10.56 GHz. This frequency interval is sub-divided into five frequency band groups. In general, three frequency sub-bands respectively having center frequencies of 3.432 GHz, 3.960 GHz and 4.488 GHz in a first one of the frequency band groups (i.e., 3.168 GHz to 4.752 GHz) take turns in transmitting data.

FIG. 1 illustrates a conventional UWB receiver circuit 100. When an antenna 11 receives a radio frequency (RF) signal transmitted in the aforementioned manner, the RF signal is first amplified by a low-noise amplifier (LNA) 12, and then filtered by three filtering inductors 13a, 13b, 13c connected to the low-noise amplifier 12. The RF signal is subsequently outputted to one of three mixers 14a, 14b, 14c that is selected according to the frequency of the RF signal for mixing with a local oscillator (LO) signal generated by a local oscillator (LO) circuit 15 so as to generate an intermediate frequency (IF) signal provided to a rear-end demodulator circuit 16, which performs demodulation to recover data in the RF signal.

It is apparent from FIG. 1 that the conventional mixers 14a, 14b, 14c are configured to receive only one RF signal. Accordingly, when the bandwidth of the low-noise amplifier 12 is insufficient such that additional low-noise amplifiers are needed, corresponding sets of the mixers must be added, which increases overall circuit area and costs.

FIG. 2 illustrates another conventional UWB receiver circuit, which uses switches to control parallel connection of a respective capacitor 15a, 15b, 15c to a corresponding filtering inductor 13a, 13b, 13c. FIG. 3 illustrates another conventional UWB receiver circuit, which uses switches to control series connection of a respective inductor 16a, 16b, 16c to a corresponding filtering inductor 13a, 13b, 13c. Through selective connection and disconnection of a respective capacitor or a respective inductor to the filtering inductors 13a, 13b, 13c, different filtering frequency responses are generated so that two RF signals with different frequencies can be filtered in turns for subsequent output to the same mixer. However, parasitic resistances of the switches will cause signal attenuation when the switches are closed. Moreover, parasitic capacitances of the switches will result in a drift in the filtering frequency response when the switches are opened. Accordingly, signals are unable to be accurately filtered for UWB communications, thus leading to unsatisfactory signal quality.

SUMMARY OF THE INVENTION

Therefore, an object of the present invention is to provide a multi-input mixer, a mixer device, and a mixing method that can overcome the above drawbacks associated with the prior art.

According to one aspect of the present invention, there is provided a multi-input mixer that comprises a first differential pair circuit, a plurality of first transistors, and a selecting circuit. The first differential pair circuit includes a pair of transistors with source terminals coupled to each other. Gate terminals of the pair of transistors receive a differential input signal. The plurality of first transistors are coupled in parallel. A drain terminal of each of the plurality of first transistors is coupled to the source terminals of the pair of transistors of the first differential pair circuit. Gate terminals of the plurality of first transistors receive a respective radio frequency input signal. Each of the plurality of first transistors determines to mix the respective radio frequency input signal with the differential input signal to generate a first differential output signal at an output of the first differential pair circuit according to an enable signal. The selecting circuit is coupled to the gate terminals of the plurality of first transistors, receives a control signal, and generates the enable signal.

According to another aspect of the present invention, there is provided a mixer device that comprises a differential circuit, a transconductance circuit, and a selecting circuit. The differential circuit receives a differential input signal and generates a differential output signal. The transconductance circuit is coupled to the differential circuit, receives a plurality of radio frequency input signals, and determines to mix at least one of the radio frequency input signals with the differential input signal according to an enable signal. The selecting circuit is coupled to the transconductance circuit, receives a control signal, and generates the enable signal according to the control signal.

According to yet another aspect of the present invention, there is provided a mixing method that comprises the steps of: receiving a differential input signal; receiving a plurality of radio frequency input signals; mixing one of the radio frequency input signals with the differential input signal according to a control signal to generate a differential output signal; and outputting the differential output signal.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
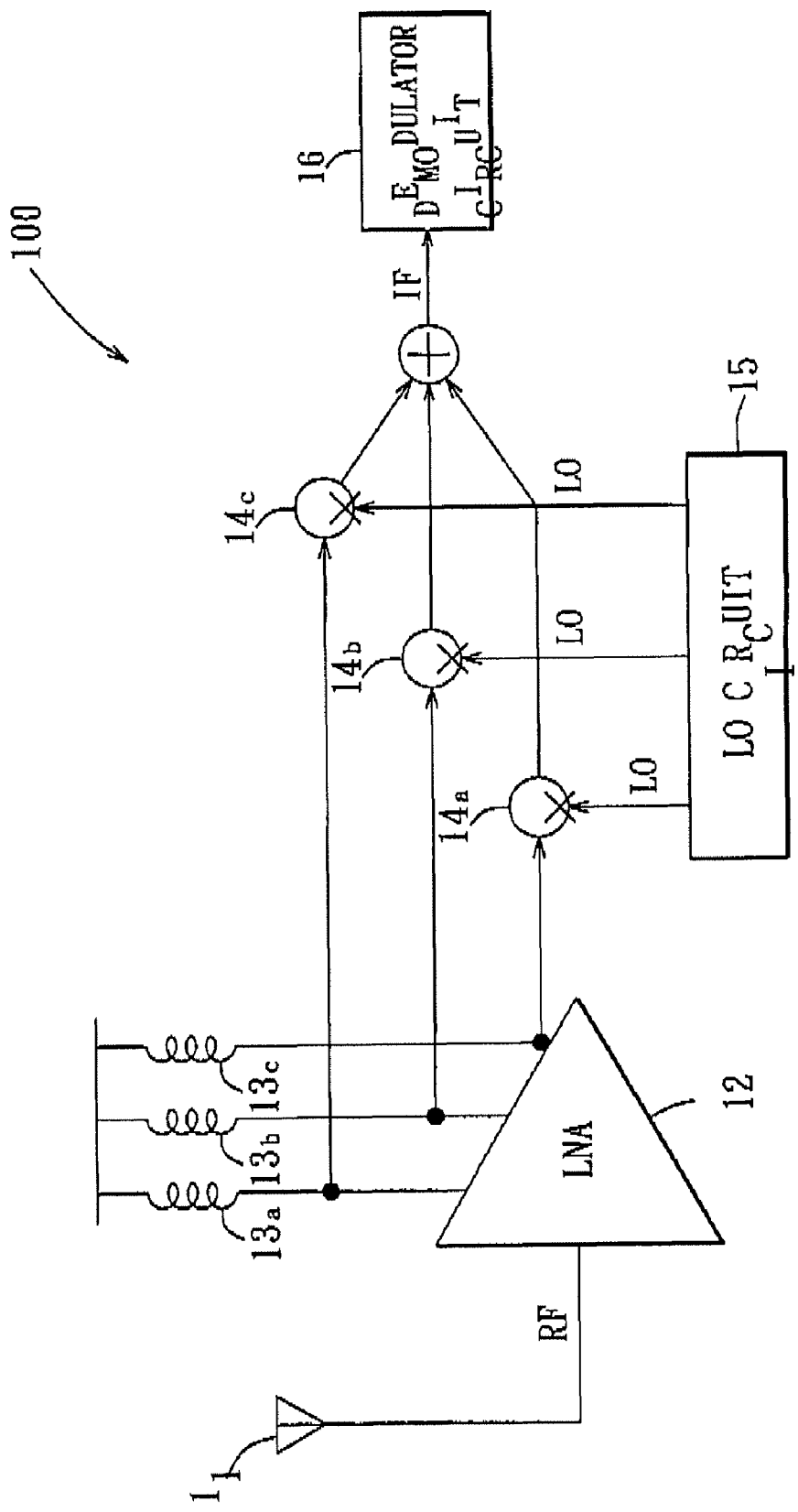
FIG. 1 is a schematic diagram of a conventional receiver circuit for a UWB communications system.
Figure 2:
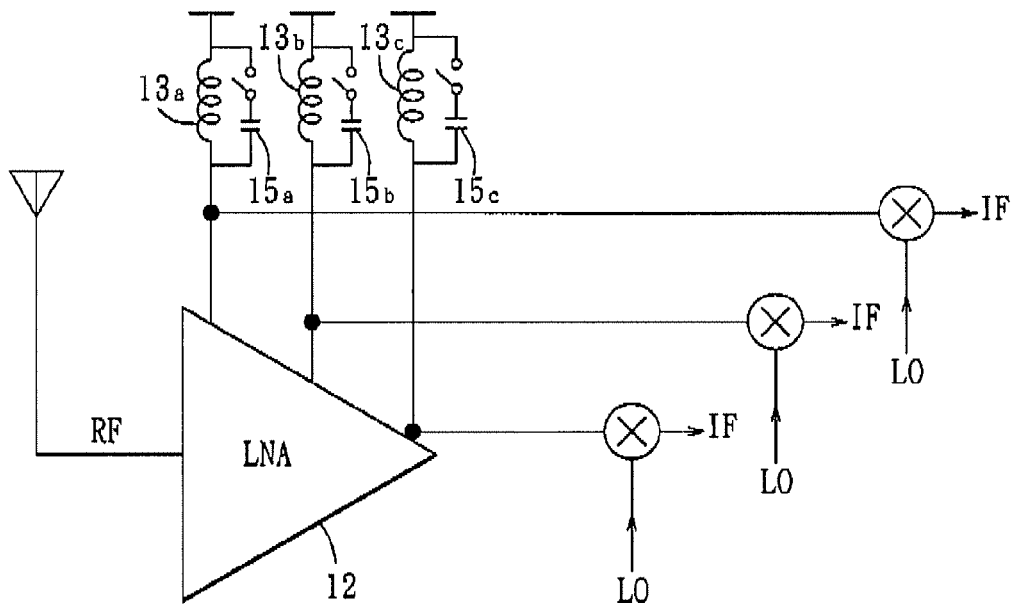
FIG. 2 is a schematic diagram of another conventional receiver circuit for a UWB communications system.
Figure 3:
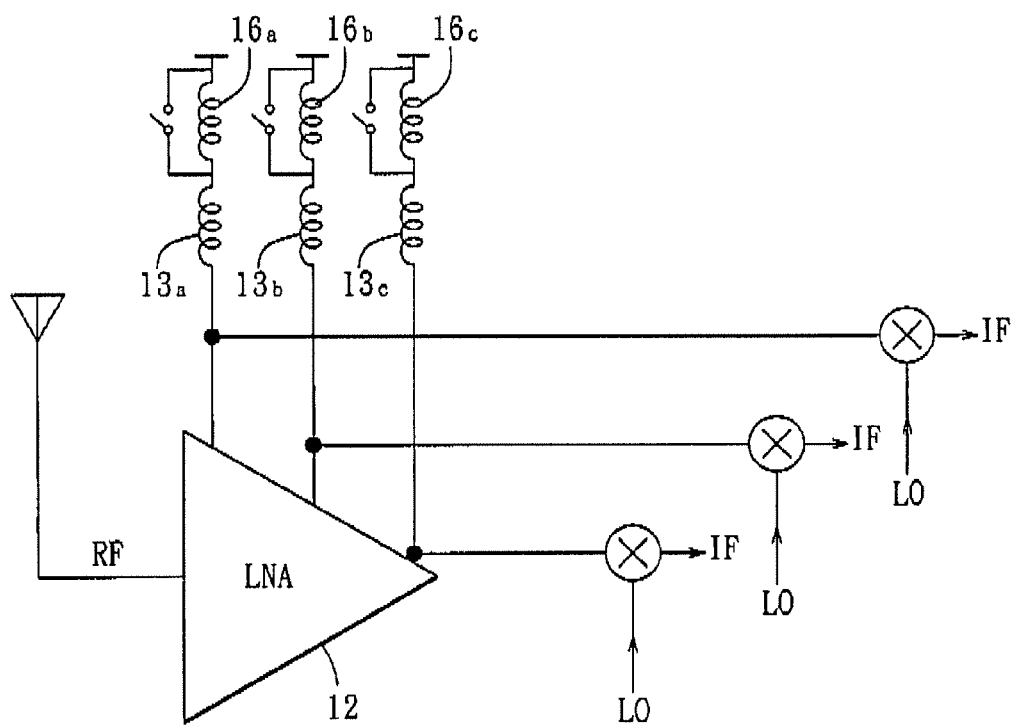
FIG. 3 is a schematic diagram of yet another conventional receiver circuit for a UWB communications system.
Figure 4:
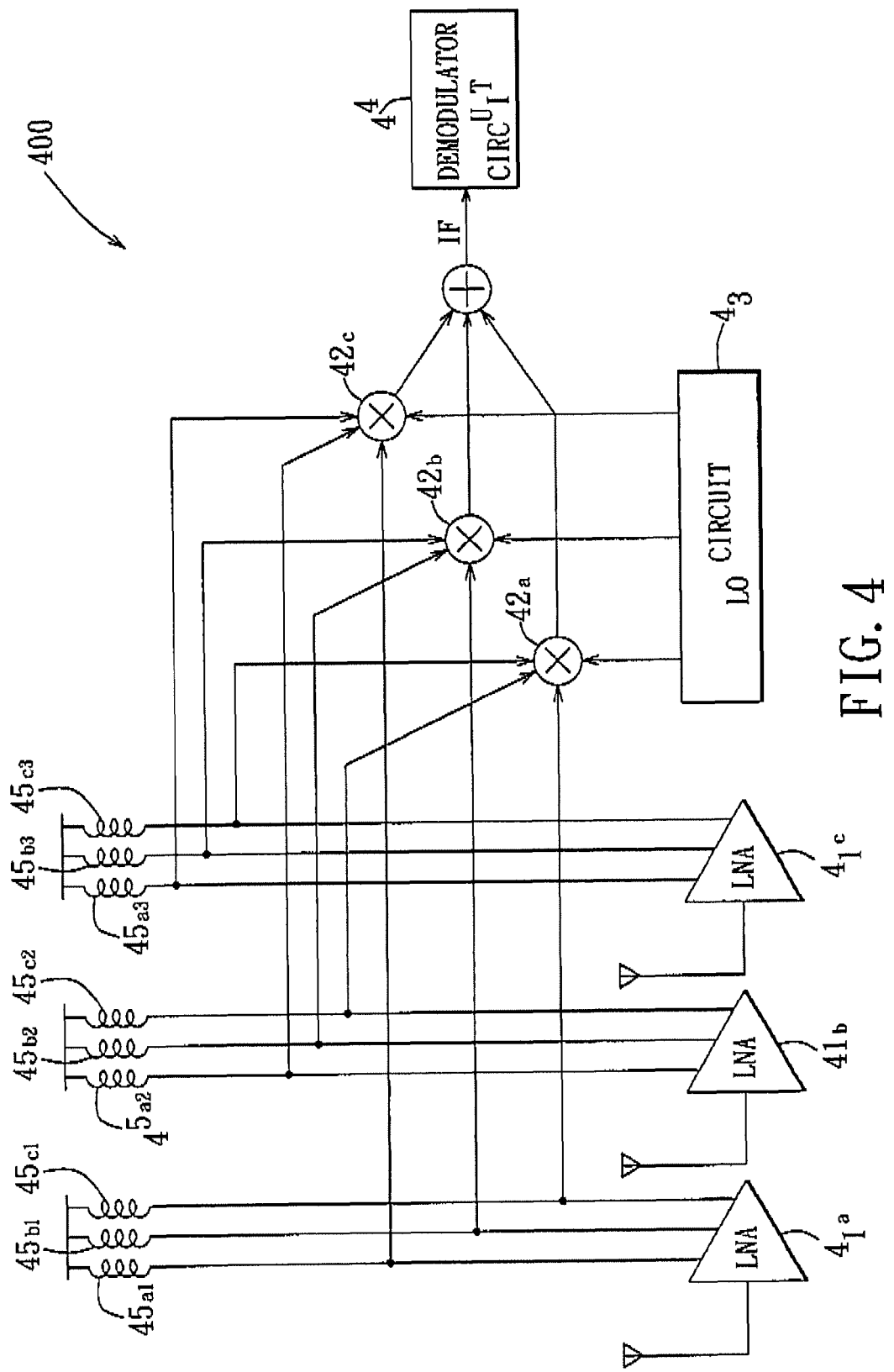
FIG. 4 is a schematic diagram of a receiver circuit for a UWB communications system that incorporates the first preferred embodiment of a multi-input mixer according to the present invention.

Referring to FIG. 4, the first preferred embodiment of a multi-input mixer (or mixer device) according to the present invention is shown to be adapted to be incorporated into a receiver circuit 400 in a UWB communications system for realizing a mixing method of this invention. In this embodiment, the receiver circuit 400 includes three low-noise amplifiers (LNA) 41a, 41b, 41c, three multi-input mixers 42a, 42b, 42c, a local oscillator (LO) circuit 43, and a demodulator circuit 44.

The low-noise amplifiers 41a, 41b, 41c are used to receive RF signals from three different frequency band groups, respectively. Each of the RF signals is amplified by the corresponding one of the low-noise amplifiers 41a, 41b, 41c for subsequent output to a selected one of the multi-input mixers 42a, 42b, 42c through filtering inductors 45a1, 45a2, 45a3, 45b1, 45b2, 45b3, 45c1, 45c2, 45c3 coupled to the low-noise amplifiers 41a, 41b, 41c. The multi-input mixers 42a, 42b, 42c mix the RF input signals received thereby with a local oscillator (LO) signal generated by the local oscillator circuit 43 so as to generate an intermediate frequency (IF) signal to be demodulated by the demodulator circuit 44.

Figure 5:
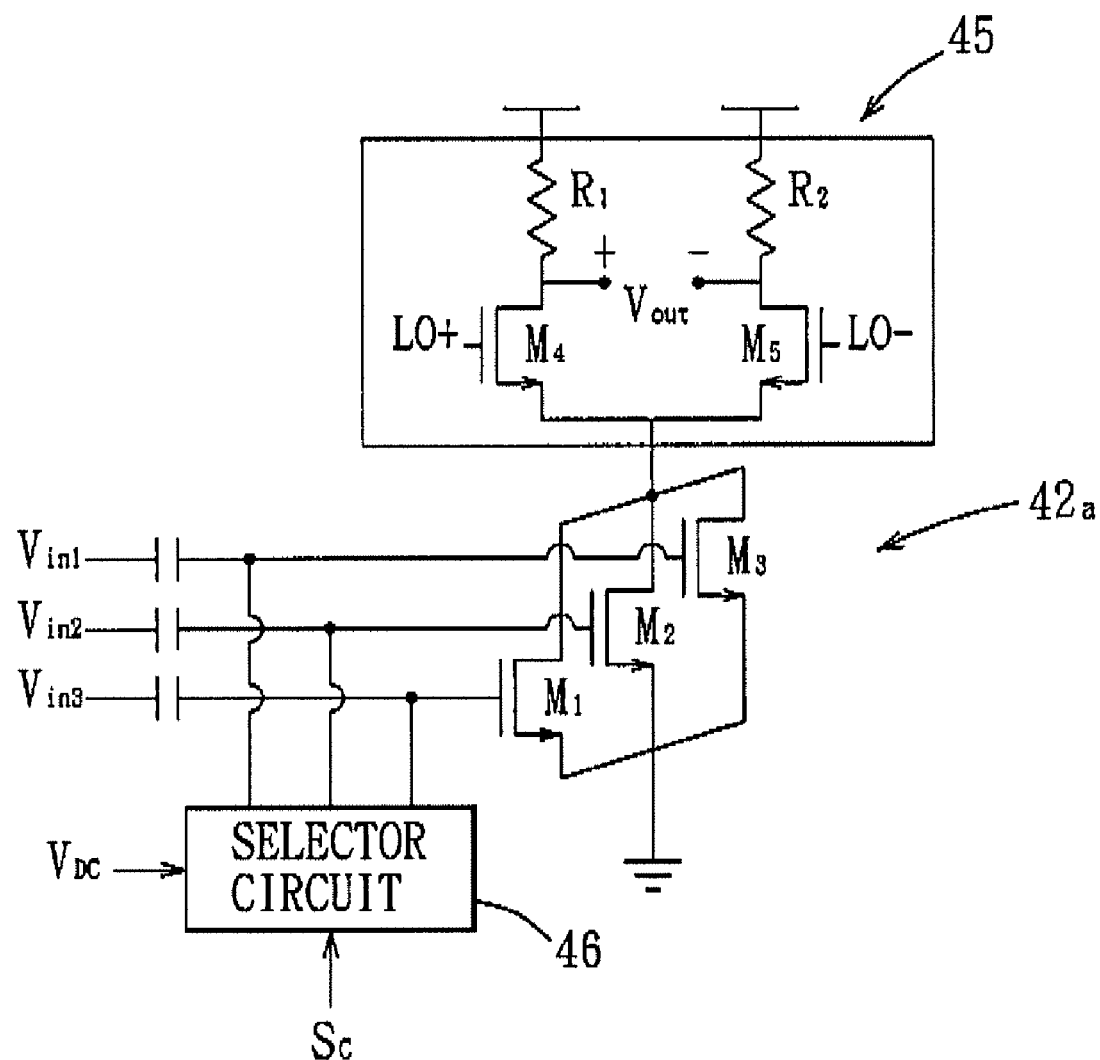
FIG. 5 is a schematic circuit diagram of the first preferred embodiment of a multi-input mixer according to the present invention.

In this embodiment, each of the multi-input mixers (or mixer devices) 42a, 42b, and 42c receives RF input signals Vin1, Vin2, Vin3 from the low-noise amplifiers 41a, 41b, and 41c, respectively, as shown in FIG. 5. Since the circuit constructions of the multi-input mixers 42a, 42b, and 42c are identical, only the multi-input mixer device 42a will be illustrated herein to explain the mixing method of this invention.

Referring to FIG. 5, the multi-input mixer 42a in this embodiment is a single balanced mixer, and includes a differential pair circuit (or differential circuit) 45, a transconductance circuit coupled to the differential pair circuit 45, and a selecting circuit 46 coupled to the transconductance circuit. The transconductance circuit includes a plurality of transistors (three MOS transistors M1, M2, and M3 are used in this embodiment).

The gate terminal of each MOS transistor M1, M2, and M3 receives the RF input signal Vin1, Vin2, and Vin3 from a corresponding one of the low-noise amplifiers 41a, 41b, and 41c through a respective capacitor coupled thereto. The MOS transistors M1, M2, and M3 have drain terminals that are interconnected, and source terminals that are grounded.

The differential pair circuit 45 includes a pair of MOS transistors M4, M5 and two resistors R1, R2 coupled to the drain terminals of the MOS transistors M4, M5, respectively. The source terminals of the MOS transistors M4, M5 are interconnected and are coupled to the drain terminals of the MOS transistors M1, M2, and M3. The gate terminals of the MOS transistors M4, M5 receive a positive polarity LO signal (LO+) and a negative polarity LO signal (LO−) from the local oscillator circuit 43, respectively. The negative polarity LO signal (LO−) and the positive polarity LO signal (LO+) constitute a differential input signal (or balanced input signal).

The selecting circuit 46 is coupled to the gate terminals of the MOS transistors M1, M2, and M3, receives a drive voltage (VDC) and a control signal (Sc), and generates an enable signal based on the control signal (Sc). In particular, in response to the control signal (Sc), the selecting circuit 46 selects which one of the MOS transistors M1, M2, M3 is to receive the drive voltage (VDC), which serves as the enable signal, such that the selected one of the MOS transistors M1, M2, and M3 permits mixing of the RF input signal received thereby with the LO signals (LO+), (LO−) that are provided to the differential pair circuit 45 by the local oscillator circuit 43, thereby enabling the differential pair circuit 45 to generate a differential output signal (which is an intermediate frequency signal Vout in this embodiment) between the drain terminals of the MOS transistors M4, M5. The differential output signal is provided to the demodulator circuit 44 at the rear end for subsequent demodulation.

It is noted that the enable signal includes a plurality of activation signals, each of which is provided to the gate terminal of a respective one of the MOS transistors M1, M2, and M3. Each of the activation signals has at least two voltage levels, and a first one of the voltage levels is a voltage level for causing the respective one of the MOS transistors M1, M2, and M3 to execute transconductance operation.

In a possible modification of the first preferred embodiment, according to requirements of the user over the RF signals, the control signal (Sc) can be for power switch control such that the MOS transistor corresponding to a desired RF input signal is provided with a voltage to enable the same to permit mixing processing. For instance, if it is desired to perform a mixing operation upon the RF input signal (Vin1), the control signal (Sc) can be set to shut down the MOS transistors M2, M3 and to cause the MOS transistor M1 to work so that mixing processing of the differential input signal (that is, the LO signals (LO+), (LO−)) and the RF input signal (Vin1) is permitted.

It has thus been shown that the multi-input mixers 42a, 42b, and 42c of this embodiment are able to receive multiple signal inputs, and permit mixing of one of a plurality of RF input signals at a time through the control of the selecting circuit 46. Since one mixer is sufficient for mixing a plurality of RF input signals one at a time, the need for additional mixers is eliminated to thereby avoid an increase in circuit area size attributed to the additional mixers. Moreover, since this embodiment does not require switches for switching of signals inputted into the mixer, signal attenuation and drift in filtering frequency response that are attributed to the use of the switches in the prior art can be avoided.

Furthermore, if the receiver circuit only includes one low-noise amplifier, it is feasible to use just one multi-input mixer for receiving the RF signals of three different frequencies from the low-noise amplifier instead of using three conventional single-input mixers, thereby reducing the circuit area size.

Figure 6:
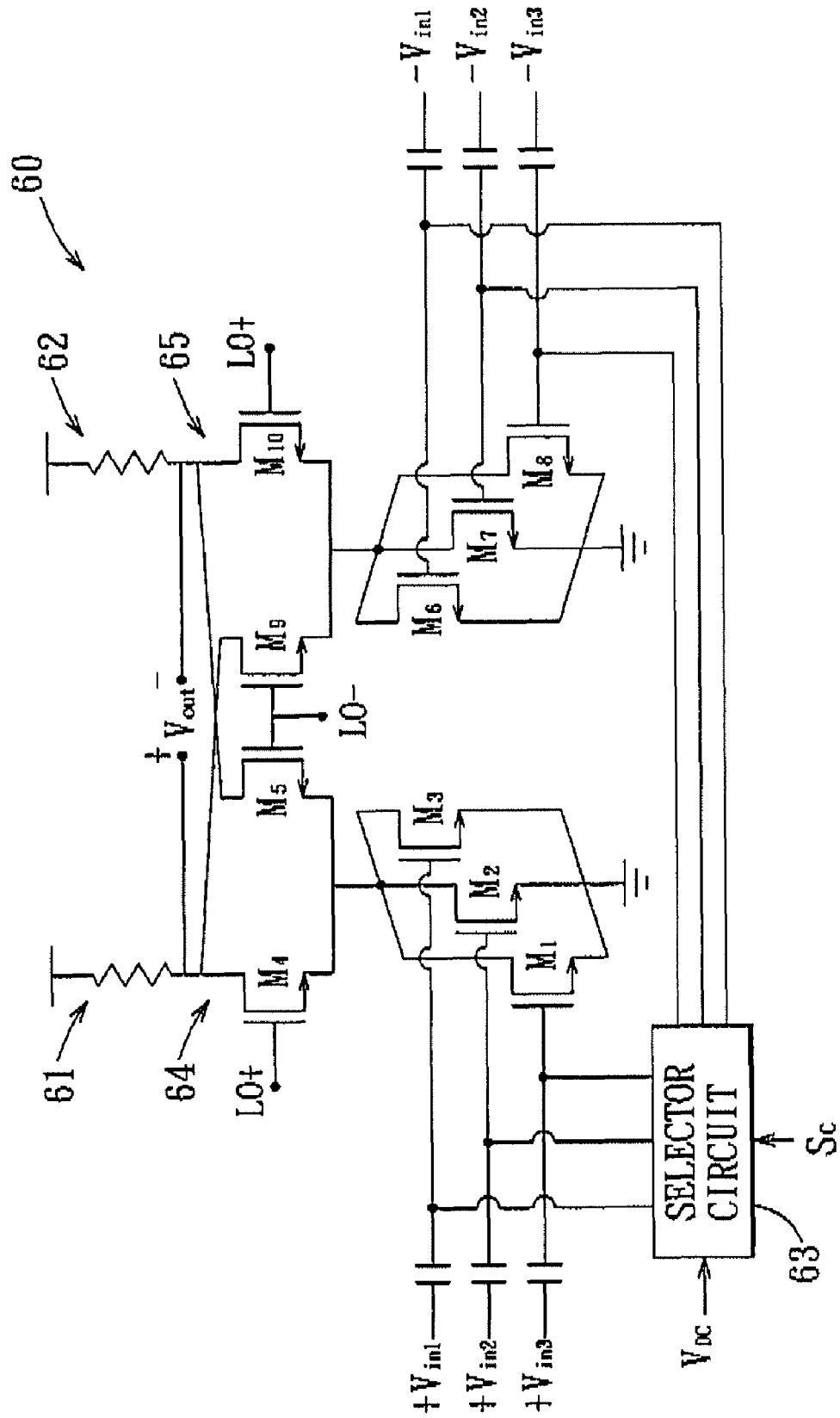
FIG. 6 is a schematic circuit diagram of the second preferred embodiment of a multi-input mixer according to the present invention.

Referring to FIG. 6, the second preferred embodiment of a multi-input mixer according to the present invention differs from the first preferred embodiment in that the multi-input mixer 60 of this embodiment is a double balanced mixer to replace the single balanced mixer of the previous embodiment. The mixer 60 is formed from two single balanced mixers 61, 62 and a selecting circuit 63.

The gate terminal of each of three first MOS transistors M1, M2, and M3 of the single balanced mixer 61 receives a corresponding one of three positive polarity RF input signals +Vin1, +Vin2, and +Vin3 through a respective capacitor coupled thereto. The gate terminal of each of three second MOS transistors M6, M7, M8 of the single balanced mixer 62 receives a corresponding one of three negative polarity RF input signals −Vin1, −Vin2, and −Vin3 through a respective capacitor coupled thereto. The polarities of the negative polarity RF input signals −Vin1, −Vin2, and −Vin3 are opposite to those of the positive polarity RF input signals +Vin1, +Vin2, and +Vin3. The positive polarity RF input signals +Vin1, +Vin2, +Vin3 and the negative polarity RF input signals −Vin1, −Vin2, −Vin3 form a balanced signal input.

The gate terminals of the MOS transistors M4, M5 of a first differential pair circuit 64 of the single balanced mixer 61 and the gate terminals of the MOS transistors M9, M10 of a second differential pair circuit 65 of the single balanced mixer 62 receive a positive polarity LO signal (LO+) and a negative polarity LO signal (LO−) from the local oscillator circuit 43 (see FIG. 4), which form a balanced signal input.

The selecting circuit 63 is coupled to the gate terminals of the MOS transistors M1, M2, and M3 of the single balanced mixer 61 and the gate terminals of the MOS transistors M6, M7, and M8 of the single balanced mixer 62. Based on a control signal (Sc) received thereby, the selecting circuit 63 simultaneously provides a drive voltage (VDC), which serves as an enable signal, to one of the first MOS transistors M1, M2, and M3, and a corresponding one of the second MOS transistors M6, M7, and M8. The RF input signals received by the selected first and second MOS transistors (such as the MOS transistors M1, M6) have the same magnitude but different polarities. Accordingly, the RF input signals with the same magnitude but different polarities are permitted to mix with the positive polarity LO signal (LO+) and the negative polarity LO signal (LO−) that are received by the first and second differential pair circuits 64, 65 so as to generate a differential output signal (Vout) at the output ends (that is, between the drain terminals of the MOS transistors M4 and M10) of the first and second differential pair circuits 64, 65. In this embodiment, the differential output signal (Vout) is an intermediate frequency signal that is provided to the demodulator circuit 44 (see FIG. 4) at the rear end for subsequent demodulation.

While the double balanced mixer of this embodiment provides better signal quality compared to the single balanced mixer of the first preferred embodiment, a larger circuit area size is needed for implementation.

Figure 7:
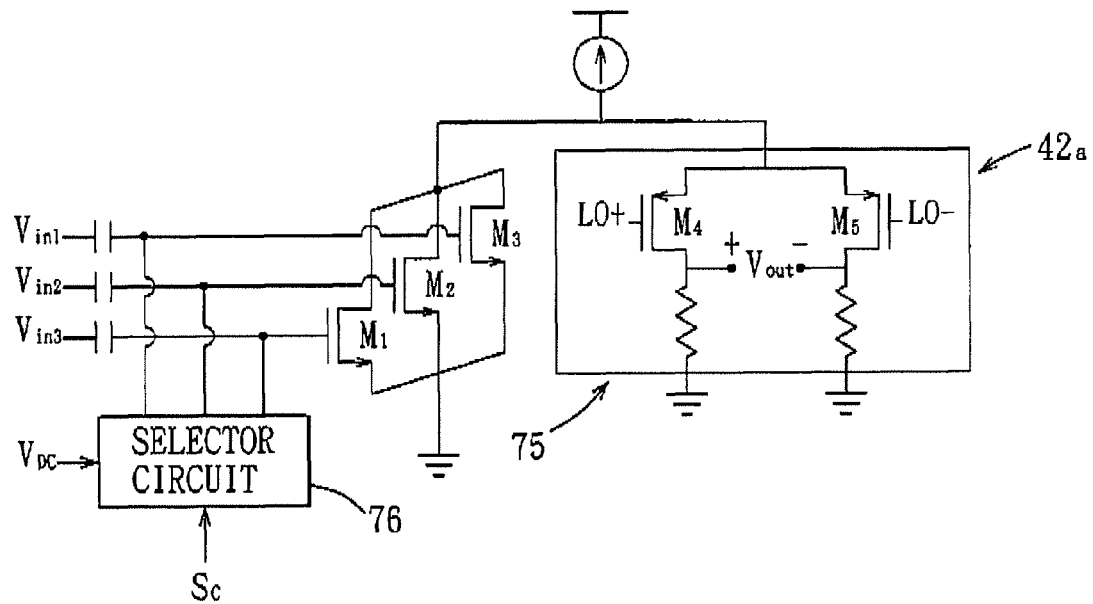
FIG. 7 is a schematic circuit diagram of the third preferred embodiment of a multi-input mixer according to the present invention.

Referring to FIG. 7, the third preferred embodiment of a multi-input mixer 42a of the present invention is shown to be in a form of a single balanced mixer that includes a plurality of transistors (three MOS transistors M1, M2, and M3 in this embodiment), a differential pair circuit 75, and a selecting circuit 76. This embodiment differs from the first preferred embodiment in that the transistors used in the differential pair circuit 75 are PMOS transistors. Since this embodiment operates in a way similar to that described hereinabove in connection with the first preferred embodiment, further details of the third preferred embodiment are omitted herein for brevity.

Figure 8:
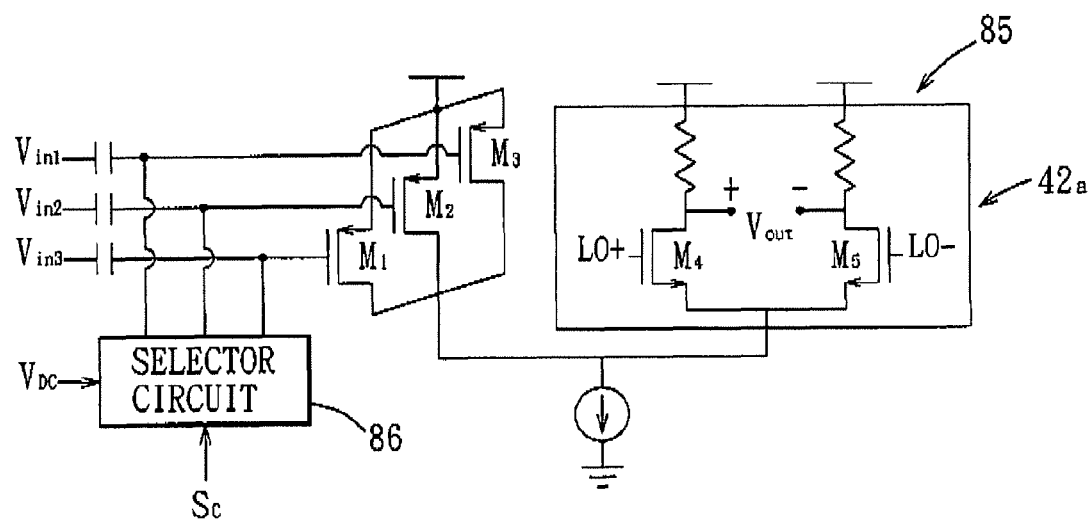
FIG. 8 is a schematic circuit diagram of the fourth preferred embodiment of a multi-input mixer according to the present invention.

Referring to FIG. 8, the fourth preferred embodiment of a multi-input mixer 42a of the present invention is shown to be in a form of a single balanced mixer that includes a plurality of transistors (three MOS transistors M1, M2, and M3 in this embodiment), a differential pair circuit 85, and a selecting circuit 86. This embodiment differs from the first preferred embodiment in that the MOS transistors M1, M2, and M3 are PMOS transistors. Since this embodiment also operates in a way similar to that described hereinabove in connection with the first preferred embodiment, further details of the fourth preferred embodiment are omitted herein for brevity.

It is apparent from the foregoing that the number of MOS transistors used to receive the RF input signals in the multi-input mixer of this invention can be increased to receive a corresponding increased number of the RF input signals without the need for additional mixers, thereby effectively reducing circuit area size. Moreover, since switches are not required for switching of signals inputted into the mixer, signal attenuation and drift in filtering frequency response attributed to the use of the switches in the prior art can be avoided.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A multi-input mixer comprising:
   a first differential pair circuit including a pair of transistors with source terminals coupled to each other, gate terminals of the pair of transistors receiving a differential input signal;
   a plurality of first transistors that are coupled in parallel, a drain terminal of each of the plurality of first transistors being coupled to the source terminals of the pair of transistors of the first differential pair circuit, gate terminals of the plurality of first transistors receiving a respective radio frequency input signal, each of the plurality of first transistors determining to mix the respective radio frequency input signal with the differential input signal to generate a first differential output signal at an output of the first differential pair circuit according to an enable signal; and
   a selecting circuit coupled to the gate terminals of the plurality of first transistors, for receiving a control signal and generating the enable signal.

2. The multi-input mixer of claim 1, wherein the differential input signal is a differential local oscillator signal, and the first differential output signal is an intermediate frequency signal.

3. The multi-input mixer of claim 1, wherein at least one of the plurality of first transistors is coupled to a respective capacitor via the respective gate terminal and receives the respective radio frequency input signal via the respective capacitor.

4. The multi-input mixer of claim 1, further comprising:
   a second differential pair circuit comprising a pair of transistors with source terminals coupled to each other, gate terminals of the pair of transistors of the second differential pair circuit receiving the differential input signal; and
   a plurality of second transistors that are coupled in parallel and that correspond in number to the plurality of first transistors, a drain terminal of each of the plurality of second transistors being coupled to the source terminals of the pair of transistors of the second differential pair circuit, gate terminals of the plurality of second transistors receiving a reverse polarity signal of a respective one of the radio frequency input signals received by the first transistors, each of the plurality of second transistors determining to mix the reverse polarity signal of the respective one of the radio frequency input signals with the differential input signal to generate a second differential output signal at an output of the second differential pair circuit according to the enable signal;
   wherein the selecting circuit is coupled to the gate terminals of the plurality of second transistors.

5. The multi-input mixer of claim 4, wherein the second differential output signal is substantially equal to the first differential output signal.

6. The multi-input mixer of claim 4, wherein at least one of the plurality of second transistors is coupled to a respective capacitor via the respective gate terminal and receives the reverse polarity signal of the respective one of the radio frequency input signals via the respective capacitor.

7. The multi-input mixer of claim 1, wherein the enable signal comprises a plurality of activation signals, the activation signals being provided to the gate terminals of the plurality of first transistors, respectively.

8. The multi-input mixer of claim 7, wherein each of the activation signals has at least two voltage levels, a first one of the voltage levels being used to cause the plurality of first transistors to work.

9. The multi-input mixer of claim 4, wherein the enable signal comprises a plurality of activation signals, the activation signals being provided to the gate terminals of the plurality of first and second transistors, respectively.

10. The multi-input mixer of claim 9, wherein each of the activation signals has at least two voltage levels, a first one of the voltage levels being used to cause the plurality of first and second transistors to work.

11. A mixer device, comprising:
a differential circuit for receiving a differential input signal and generating a differential output signal;
a transconductance circuit, coupled to the differential circuit, for receiving a plurality of radio frequency input signals, and determining to mix at least one of the radio frequency input signals with the differential input signal according to an enable signal; and
a selecting circuit, coupled to the transconductance circuit, for receiving a control signal and generating the enable signal according to the control signal.

12. The mixer device of claim 11, wherein the differential circuit comprises:
a first differential pair circuit comprising a first transistor and a second transistor, the first and second transistors respectively receiving a forward polarity signal and a reverse polarity signal of the differential input signal via gate terminals, the first and second transistors respectively outputting a forward polarity signal and a reverse polarity signal of the differential output signal via drain terminals, a source terminal of the first transistor being coupled to a source terminal of the second transistor.

13. The mixer device of claim 11, wherein the transconductance circuit comprises:
a plurality of transistors coupled in parallel, wherein each of the plurality of transistors receives a respective one of the radio frequency input signals via a respective gate terminal.

14. The mixer device of claim 13, wherein the selecting circuit is coupled to the gate terminals of the plurality of transistors, and determines the plurality of transistors to be turned on or turned off according to the control signal.

15. The mixer device of claim 12, wherein the transconductance circuit is coupled to the source terminal of the first transistor of the first differential pair circuit.

16. The mixer device of claim 11, wherein the differential circuit comprises:
a first differential pair circuit including a first transistor and a second transistor, wherein a source terminal of the first transistor is coupled to a source terminal of the second transistor, gate terminals of the first and second transistors respectively receiving a forward polarity signal and a reverse polarity signal of the differential input signal, a drain terminal of the first transistor outputting a forward polarity signal of the differential output signal; and
a second differential pair circuit comprising a third transistor and a fourth transistor, wherein a source terminal of the third transistor is coupled to a source terminal of the fourth transistor, gate terminals of the third and fourth transistors respectively receiving a forward polarity signal and a reverse polarity signal of the differential input signal, a drain terminal of the fourth transistor outputting a reverse polarity signal of the differential output signal;
wherein a drain terminal of the third transistor is coupled to the drain terminal of the first transistor, and a drain terminal of the second transistor is coupled to the drain terminal of the fourth transistor.

17. The mixer device of claim 16, wherein the transconductance circuit comprises:
a plurality of fifth transistors, coupled in parallel, and a gate terminal of each of the plurality of fifth transistors receiving a respective one of the radio frequency input signals; and
a plurality of sixth transistors, coupled in parallel, and a gate terminal of each of the plurality of sixth transistors receiving a respective one of the radio frequency input signals;
wherein the plurality of fifth transistors are coupled to the source terminal of the first differential pair circuit, and the plurality of sixth transistors are coupled to the source terminal of the second differential pair circuit.

18. The mixer device of claim 11, wherein the differential input signal is a differential local oscillator signal, and the differential output signal is an intermediate frequency signal.

19. The mixer device of claim 14, wherein the enable signal comprises a plurality of activation signals, the activation signals being provided to the gate terminals of the plurality of transistors of the transconductance circuit, respectively.

20. The mixer device of claim 19, wherein each of the activation signals has at least two voltage levels, a first one of the voltage levels being used to cause the plurality of transistors to work.

21. The mixer device of claim 17, wherein the enable signal comprises a plurality of activation signals, the activation signals being provided to the gate terminals of the plurality of fifth and sixth transistors.

22. The mixer device of claim 21, wherein each of the activation signals has at least two voltage levels, a first one of the voltage levels being used to cause the plurality of fifth and sixth transistors to work.

23. A mixing method, comprising the steps of:
receiving a differential input signal;
receiving a plurality of radio frequency input signals;
mixing one of the radio frequency input signals with the differential input signal according to a control signal to generate a differential output signal; and
outputting the differential output signal;
wherein the step of mixing includes:
providing a selecting circuit for generating an enable signal according to the control signal; and
providing a transconductance circuit for mixing one of the radio frequency input signals with the differential input signal according to the enable signal.

24. The mixing method of claim 23, wherein the differential input signal is a differential local oscillator signal, and the differential output signal is an intermediate frequency signal.

* * * * *

UNITED STATES PATENT AND TRADEMARK OFFICE
CERTIFICATE OF CORRECTION

PATENT NO.        : 7,830,198 B2                                    Page 1 of 1
APPLICATION NO.   : 12/109506
DATED             : November 9, 2010
INVENTOR(S)       : Ren-Chieh Liu et al.

It is certified that error appears in the above-identified patent and that said Letters Patent is hereby corrected as shown below:

On the title page, Item (75), Inventors, line 2, delete "Turut Sefket Aytur," and insert -- Turgut Sefket Aytur, --, therefor.

Signed and Sealed this
Twenty-seventh Day of March, 2012

David J. Kappos
*Director of the United States Patent and Trademark Office*